United States Patent
Chen et al.

(10) Patent No.: US 12,431,865 B2
(45) Date of Patent: Sep. 30, 2025

(54) RESONANT STRUCTURE IN MICRO ELECTRO MECHANICAL SYSTEMS

(71) Applicant: ZILLTEK TECHNOLOGY CORP., Hsinchu (TW)

(72) Inventors: Jen-Yi Chen, Hsinchu (TW); Yu-Min Chuang, Hsinchu (TW); Yan-Ming Huang, Hsinchu (TW)

(73) Assignee: ZILLTEK TECHNOLOGY CORP., Hsinchu (TW)

( * ) Notice: Subject to any disclaimer, the term of this patent is extended or adjusted under 35 U.S.C. 154(b) by 256 days.

(21) Appl. No.: 18/317,090

(22) Filed: May 14, 2023

(65) Prior Publication Data
US 2024/0267027 A1    Aug. 8, 2024

(30) Foreign Application Priority Data
Feb. 8, 2023  (TW) ................................ 112104342

(51) Int. Cl.
*H03H 9/24*  (2006.01)
*H03H 9/02*  (2006.01)

(52) U.S. Cl.
CPC ...... *H03H 9/2494* (2013.01); *H03H 9/02259* (2013.01)

(58) Field of Classification Search
None
See application file for complete search history.

(56) References Cited

U.S. PATENT DOCUMENTS

| | | | |
|---|---|---|---|
| 6,587,021 B1 * | 7/2003 | Streeter | H01H 1/0036 333/262 |
| 6,713,367 B2 * | 3/2004 | Solgaard | G02B 6/122 438/738 |
| 8,519,809 B1 * | 8/2013 | Fu | H01H 59/0009 335/78 |
| 2006/0087390 A1 * | 4/2006 | Yuba | H01H 59/0009 335/78 |

* cited by examiner

*Primary Examiner* — Bernard Rojas
(74) *Attorney, Agent, or Firm* — Li & Cai Intellectual Property Office (57) ABSTRACT

A resonant structure in micro electro mechanical systems includes a main body and at least one electrode. The main body has a major axis. The main body includes an induction portion and a support portion. The induction portion has at least one first induction side surface that is not parallel to the major axis. The main body has a plurality of first protruding teeth on the first induction side surface. The electrode has a second induction side surface that is not parallel to the major axis. The electrode has a plurality of second protruding teeth on the second induction side surface. When a separation distance between the first induction side surface and the second induction side surface is changed, a plurality of surfaces of the first protruding teeth and a plurality of surfaces of the second protruding teeth are configured to produce a capacitance change.

11 Claims, 8 Drawing Sheets

RESONANT STRUCTURE IN MICRO ELECTRO MECHANICAL SYSTEMS

CROSS-REFERENCE TO RELATED PATENT APPLICATION

This application claims the benefit of priority to Taiwan patent application Ser. No. 11/210,4342, filed on Feb. 8, 2023. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a structure, and more particularly to a resonant structure in micro electro mechanical systems.

BACKGROUND OF THE DISCLOSURE

Micro-electro-mechanical-systems (i.e., MEMS) resonators are widely used in various devices, such as watches or complex telecommunications devices. In other words, the MEMS resonator includes a structure or an element that is used to resonate. In the conventional technology, the MEMS resonator includes a plurality of electrodes and a resonant structure that can be driven by the electrodes. When the electrodes are applied with a time-varying voltage signal at certain frequency and the resonant structure is subjected to a bias voltage, the MEMS resonator will start to generate a time-varying electrostatic force, vibrating at certain mode with respect to the frequency given on the electrode. However, due to the lack of structural improvement and design in the conventional MEMS resonator, an initial electrostatic force is limited, which will cause negative effect on the performance of the MEMS resonator for further applications.

SUMMARY OF THE DISCLOSURE

In response to the above-referenced technical inadequacy, the present disclosure provides a resonant structure in micro electro mechanical systems.

In order to solve the above-mentioned problem, one of the technical aspects adopted by the present disclosure is to provide a resonant structure in micro electro mechanical systems. The resonant structure includes a main body and at least one electrode. The main body has a major axis. The main body includes an induction portion and a support portion connected to the induction portion along the major axis. The induction portion includes at least one first induction side surface that is not parallel to the major axis, and the main body has a plurality of first protruding teeth on the at least one first induction side surface. The at least one electrode is disposed on one side of the induction portion, and is spaced apart from the induction portion. The at least one electrode has a second induction side surface, and the second induction side surface corresponds in position to the at least one first induction side surface and is not parallel to the major axis. The at least one electrode has a plurality of second protruding teeth on the second induction side surface, and the second protruding teeth and the first protruding teeth are interlaced and not in contact with each other. When a separation distance between the at least one first induction side surface and the second induction side surface is changed, a plurality of surfaces of the first protruding teeth and a plurality of surfaces of the second protruding teeth are configured to produce a capacitance change.

In one of the possible or preferred embodiments, the at least one first induction side surface corresponds in quantity to the at least one electrode, and a quantity of the at least one first induction side surface and a quantity of the at least one electrode are further limited to being two, and wherein each of the two electrodes is a driving electrode or a sensing electrode.

In one of the possible or preferred embodiments, the at least one first induction side surface and the second induction side surface are each at least one of an inclined surface and a curved surface.

In one of the possible or preferred embodiments, a width of the induction portion is gradually decreased along the major axis in a direction away from the support portion, so that heights of the first protruding teeth are different from each other, and the heights of the first protruding teeth are increased along the major axis in the direction away from the support portion.

In one of the possible or preferred embodiments, the main body has a first groove between any two adjacent ones of the first protruding teeth, and the first groove corresponds in position and shape to an adjacent one of the second protruding teeth, wherein the at least one electrode has a second groove between any two adjacent ones of the second protruding teeth, and the second groove corresponds in position and shape to an adjacent one of the first protruding teeth, and wherein one of a plurality of traveling lengths is defined between the first groove and one of the second protruding teeth, another one of the traveling lengths is defined between the second groove and one of the first protruding teeth, and the traveling lengths are gradually increased along the major axis in a direction away from the support portion.

In one of the possible or preferred embodiments, a plurality of tip angles of the first protruding teeth and a plurality of tip angles of the second protruding teeth are gradually decreased along the major axis in a direction away from the support portion.

In one of the possible or preferred embodiments, each of the tip angles of the first protruding teeth and each of the tip angles of the second protruding teeth are greater than or equal to 10 degrees.

In one of the possible or preferred embodiments, a width of the induction portion is gradually increased along the major axis in a direction away from the support portion, and the main body has at least one notch on the induction portion.

In one of the possible or preferred embodiments, a width of the induction portion is gradually increased along the major axis in a direction away from the support portion, so that heights of the first protruding teeth are different from each other, and the heights of the first protruding teeth are decreased along the major axis in the direction away from the support portion.

In one of the possible or preferred embodiments, a width of the induction portion is gradually increased or decreased along the major axis and in a direction away from the support portion.

Therefore, in the resonant structure provided by the present disclosure, by virtue of "the induction portion having at least one first induction side surface that is not parallel to the major axis, and the main body having a plurality of first protruding teeth on the at least one first induction side surface" and "the second induction side surface corresponding in position to the at least one first induction side surface and being not parallel to the major axis, and the at least one electrode having a plurality of second protruding teeth on the second induction side surface," the resonant structure can significantly increase the traveling length and have a large initial electrostatic force at the same time.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

First Embodiment

Figure 1:
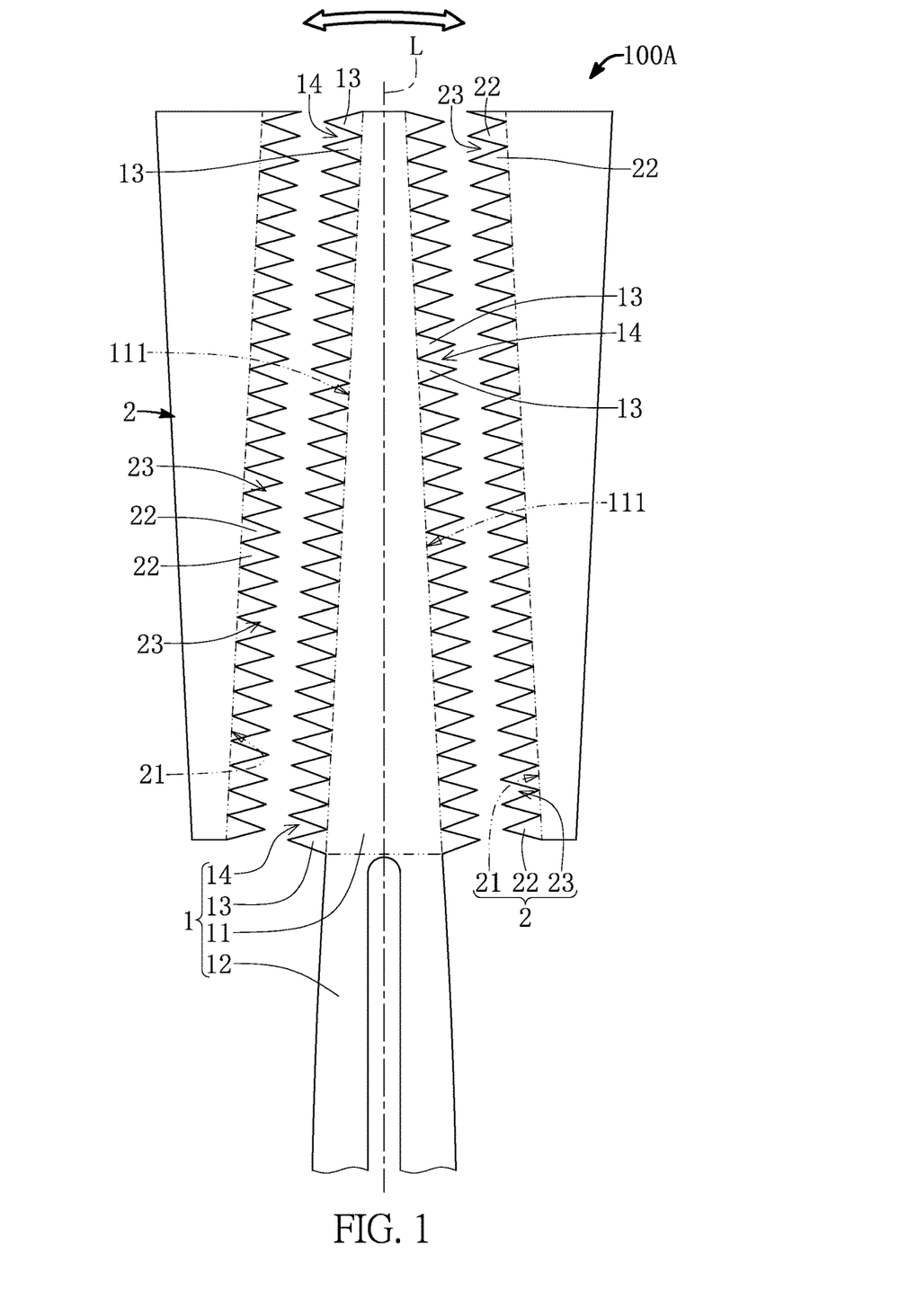
FIG. 1 is a schematic planar view of a resonant structure in micro electro mechanical systems according to a first embodiment of the present disclosure.
Figure 2:
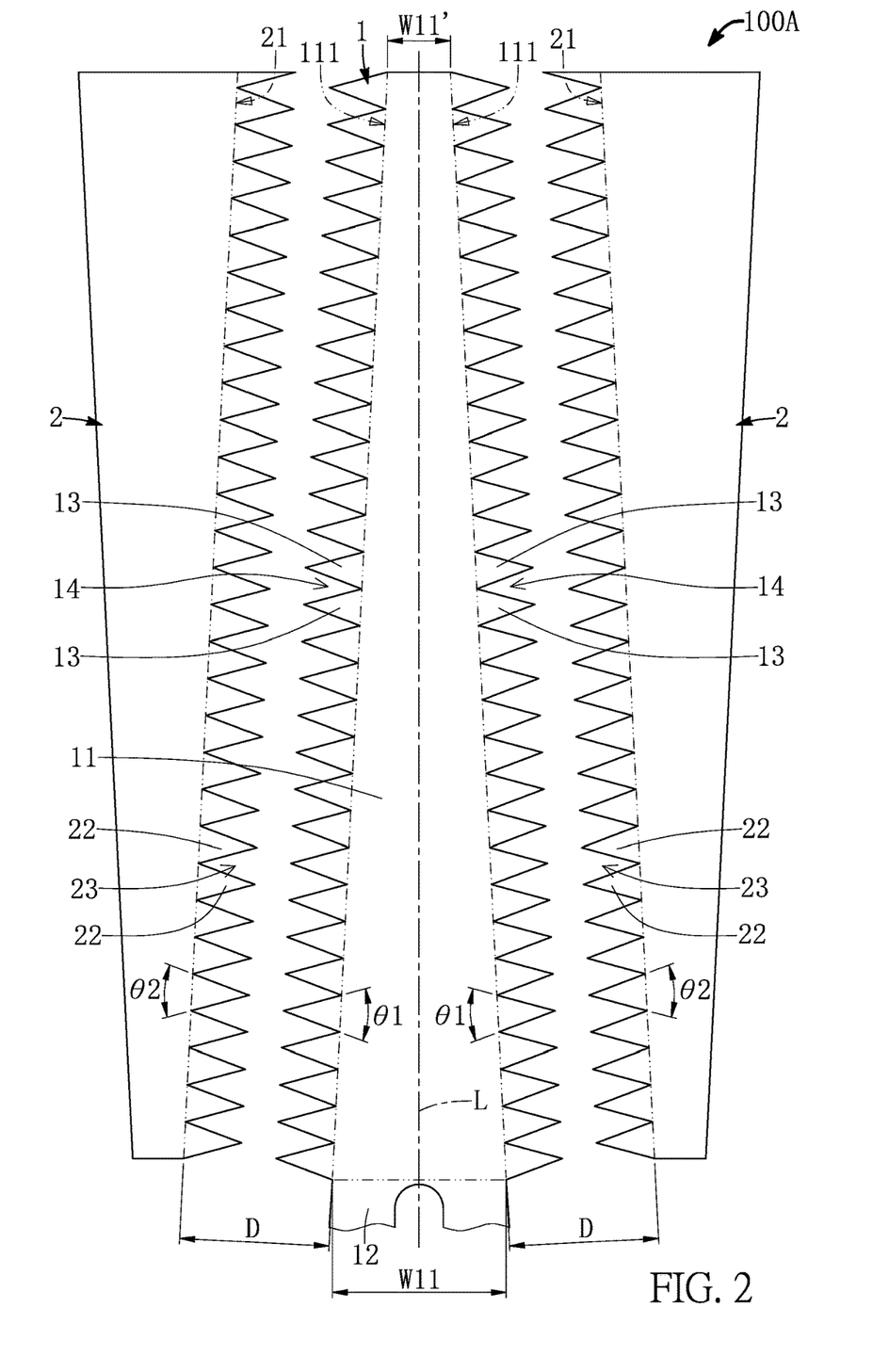
FIG. 2 is a partial schematic planar view of the resonant structure of FIG. 1.

Referring to FIG. 1 to FIG. 5, a first embodiment of the present disclosure provides a resonant structure 100A in micro electro mechanical system (i.e., MEMS). As shown in FIG. 1 and FIG. 2, the resonant structure 100A includes a main body 1 and at least one electrode 2. When a signal is input to the resonant structure 100A, a separation distance D between the main body 1 and the at least one electrode 2 will change (e.g., the main body 1 approaches the at least one electrode 2), so that the main body 1 and the at least one electrode 2 will produce capacitance changes and oscillate. In other words, any resonant structure that does not oscillate through the capacitance changes is not the resonant structure 100A of the present disclosure. The following description describes the structure and connection relation of each component of the resonant structure 100A.

Referring to FIG. 1 and FIG. 2, the main body 1 in the present embodiment is a long structure, and has a major axis L. Along the major axis L, the main body 1 includes an induction portion 11 and a support portion 12 that is connected to the induction portion 11. The support portion 12 can be disposed on other components (not shown) of the MEMS, and the support portion 12 can drive the induction portion 11 to swing along an arc path (as shown in FIG. 1), so as to change the separation distance D. However, the present disclosure is not limited thereto.

For example, in another embodiment of the present disclosure (not shown), the support portion 12 can also be horizontally and slidably disposed on other components of the MEMS, so that the support portion 12 can drive the induction portion 11 to move along a horizontal path.

A width of the induction portion 11 is gradually increased or decreased along the major axis L, so that the induction portion 11 includes at least one first induction side surface 111 that is not parallel to the major axis L. The main body 1 has a plurality of first protruding teeth 13 on the at least one first induction side surface 111.

In the present embodiment, the width of the induction portion 11 is gradually decreased along the major axis L in a direction away from the support portion 12 (e.g., a direction from a width W11 to a width W11' in FIG. 2). Accordingly, a cross section of the induction portion 11 is in a trapezoidal shape, and two side slopes of the induction portion 11 corresponding to the arc path are two lateral sides, which can be defined as the two first induction side surfaces 111. In addition, each of the two first induction side surfaces 111 has the first protruding teeth 13. In other words, a quantity of the at least one first induction side surface 111 in the present embodiment is further limited to being two, each of the two first induction side surfaces 111 is a slope, and the first protruding teeth 13 are disposed on each of the two first induction side surfaces 111, but the present disclosure is not limited thereto.

For example, in another embodiment of the present disclosure (not shown), the cross section of the induction portion 11 can also be in a quadrilateral shape that is not trapezoidal, in which three of four sides have two 90-degree angles there-between. In this way, only one of two sides of the induction portion 11 corresponding to the arc path is a slope that is not parallel to the major axis L. That is to say, the induction portion 11 has only one first induction side surface 111.

In addition, in the present embodiment, a plurality of tip angles $\theta 1$ of the first protruding teeth 13 are the same as each other, and heights H13 of the first protruding teeth 13 are also the same as each other, but the present disclosure is not limited thereto.

Figure 3:
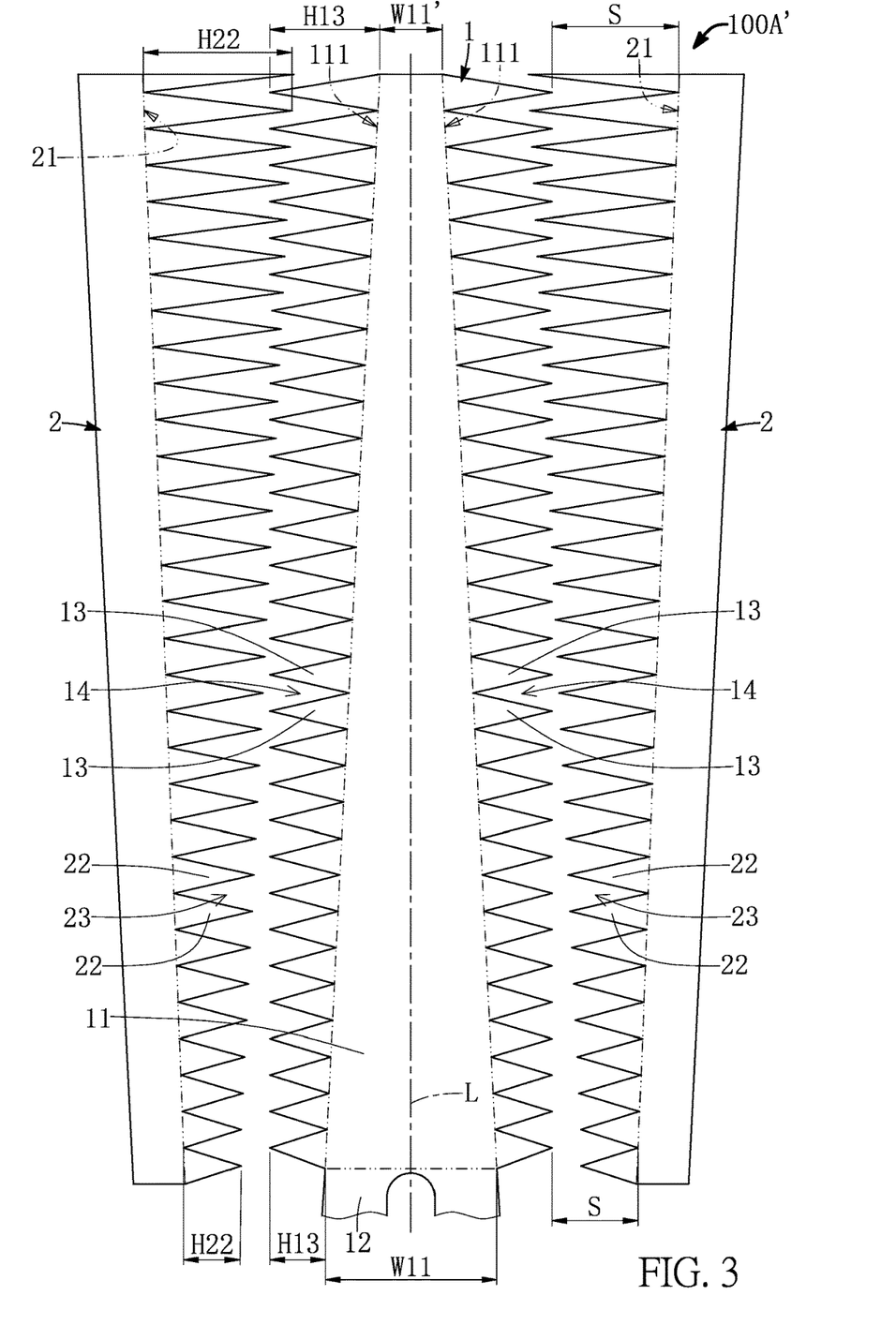
FIG. 3 is another schematic planar view of the resonant structure in the micro electro mechanical systems according to the first embodiment of the present disclosure.

For example, in a resonant structure 100A' of another embodiment (as shown in FIG. 3), the tip angles $\theta 1$ of the first protruding teeth 13 may also be different from each other, and the tip angles $\theta 1$ of the first protruding teeth 13 are gradually decreased along the major axis L in the direction away from the support portion 12. It should be noted that the tip angle $\theta 1$ of each of the first protruding teeth 13 is preferably greater than or equal to 10 degrees, so as to ensure that the first protruding teeth 13 can cooperate with the at least one electrode 2 for producing an optimal capacitance change.

In another example of the present disclosure (not shown), the tip angles $\theta 1$ of the first protruding teeth 13 are gradually increased along the major axis L in the direction away from the support portion 12. In yet another example, the tip angles $\theta 1$ of the first protruding teeth 13 on one of the two first induction side surfaces 111 may not be equal to the tip angles $\theta 1$ of the first protruding teeth 13 on another one of the two first induction side surfaces 111.

Referring to FIG. 1 and FIG. 2, the at least one electrode 2 is disposed on one side of the induction portion 11 and spaced apart from each other, and the at least one electrode 2 includes a second induction side surface 21. The second induction side surface 21 corresponds in position to the at least one first induction side surface 111, and the second induction side surface 21 is not parallel to the major axis L. In other words, the second induction side surface 21 of the at least one electrode 2 corresponds in quantity and position to the at least one first induction side surface 111. Furthermore, the second induction side surface 21 of the at least one electrode 2 faces and is not in contact with the at least one first induction side surface 111.

The electrode 2 has a plurality of second protruding teeth 22 on the second induction side surface 21, and the second protruding teeth 22 and the first protruding teeth 13 are interlaced and not in contact with each other. When the separation distance D between the at least one first induction side surface 111 and the second induction side surface 21 is changed (e.g., the induction portion 11 is driven by the support portion 12, so that the at least one first induction side surface 111 becomes nearer to the second induction side surface 21), a plurality of surfaces of the first protruding teeth 13 and a plurality of surfaces of the second protruding teeth 22 are configured to produce the capacitance change.

In the present embodiment, a quantity of the at least one electrode 2 is two. The two electrodes 2 are respectively disposed on the two sides of the induction portion 11 (along the arc path), and the two electrodes 2 are respectively a driving electrode and a sensing electrode, but the present disclosure is not limited thereto. For example, the two electrodes 2 can also be two driving electrodes or two sensing electrodes.

In addition, tip angles $\theta 2$ and heights H22 of the second protruding teeth 22 may respectively correspond to those of the first protruding teeth. In other words, the tip angles $\theta 2$ and the heights H22 of the second protruding teeth 22 may be the same as each other (as shown in FIG. 2), but the present disclosure is not limited thereto.

For example, in the resonant structure 100A' of another embodiment (as shown in FIG. 3), the second protruding teeth 22 are also different from each other, and the tip angles $\theta 2$ of the second protruding teeth 22 are gradually decreased along the major axis L in the direction away from the support portion 12. The tip angle $\theta 2$ is greater than or equal to 10 degrees, but the present disclosure is not limited thereto.

Figure 4:
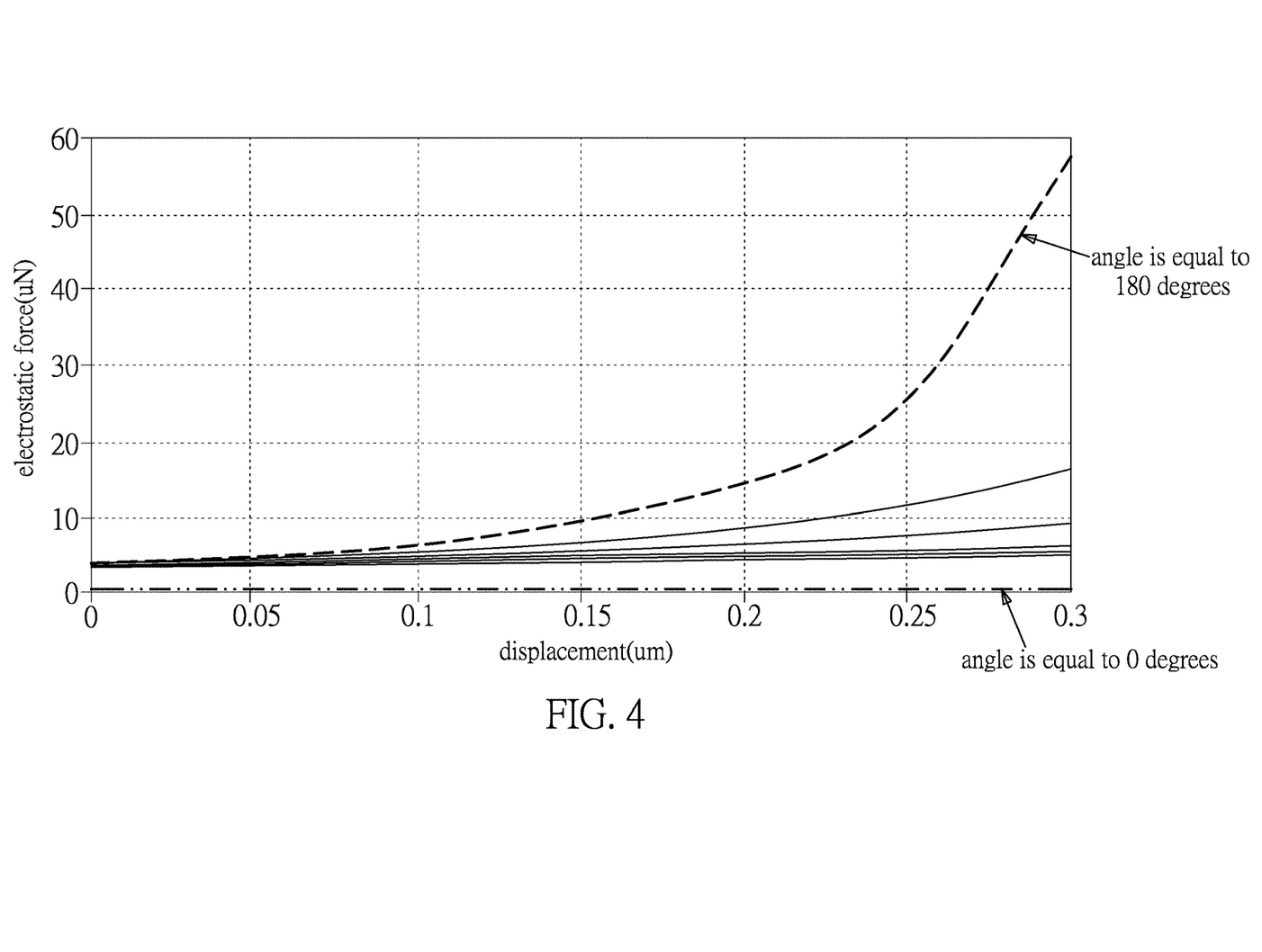
FIG. 4 is a graph illustrating a relationship between an electrostatic force and a displacement of the resonant structure according to the first embodiment of the present disclosure.

It should be noted that, as shown in FIG. 4, when the tip angles $\theta 1$ and $\theta 2$ are close to 0 degrees, the first protruding teeth 13 and the second protruding teeth 22 substantially form a comb-like structure (i.e., a comb-shaped electrode, which is not a structure of the present disclosure), and a linear relationship is formed between an electrostatic force and a displacement of the comb-like structure, so that an optimal electrostatic force for an oscillatory motion cannot be provided (e.g., an initial electrostatic force is too small when the displacement is 0). In addition, when each of the tip angles $\theta 1$ and $\theta 2$ is 180 degrees, the first protruding teeth 13 and the second protruding teeth 22 substantially form a parallel structure (i.e., a parallel capacitance plate electrode, which is not a structure of the present disclosure). However, when the electrostatic force is too large, the oscillatory motion will not be optimal (e.g., a tolerable displacement is too short when the initial electrostatic force is the same). In contrast, each of the tip angles $\theta 1$ and $\theta 2$ in the present disclosure is within a range from 0 degrees to 180 degrees (especially from 10 degrees to 180 degrees), so that the resonant structure of the present disclosure can have a large initial electrostatic force and also have an ideal displacement.

It should be noted that, when the tip angles $\theta 1$ and $\theta 2$ approach 0 degrees, the relationship between the electrostatic force and the displacement becomes more linear, so that the resonant structure 100A can have a more optimal displacement (as shown in FIG. 4). In addition, when the tip angles $\theta 1$ and $\theta 2$ approach 180 degrees, a plurality of sensing surfaces of the first protruding teeth 13 and the second protruding teeth 22 can also be significantly improved to increase the electrostatic force.

More specifically, the main body 1 has a first groove 14 between any two adjacent ones of the first protruding teeth 13, and the first groove 14 corresponds in position and shape to an adjacent one of the second protruding teeth 22 (i.e., the first groove 14 geometrically fits the second protruding tooth 22). Each of the two electrodes 2 has a second groove 23 between any two adjacent ones of the second protruding teeth 22, and the second groove 23 corresponds in position and shape to an adjacent one of the first protruding teeth 13 (i.e., the second groove 23 geometrically fits the first protruding tooth 13). Accordingly, one of a plurality of traveling lengths S is defined between the first groove 14 and one of the second protruding teeth 22, another one of the traveling lengths S is defined between the second groove 23 and one of the first protruding teeth 13, and the traveling lengths S are a moving distance of the induction portion 11. In the resonant structure 100A of the present disclosure, through the configuration of "the first induction side surface 111 and the second induction side surface 21 being not parallel to the major axis L", the traveling lengths S between the first protruding teeth 13 and the second protruding teeth 22 can be increased. In particular, the resonant structure of the present disclosure is more improved as compared with configurations in which the side of the main body is parallel to the major axis L or the side of the electrode is parallel to the major axis L (e.g., a conventional resonant structure).

In other words, from a simple harmonic motion related formula of $W_n=(k/m)^{1/2}$, when a resonant frequency W" is constant, a mass m is directly proportional to a spring constant k. Therefore, when the mass is smaller, the spring constant becomes smaller, thereby resulting in a larger displacement and a larger induced signal under the same electrostatic force. Accordingly, the width of the main body 1 is gradually decreased, and the first induction side surface 111 is not parallel to the major axis L, so that the resonant structure of the present disclosure can accommodate a larger electrode area and reduce its mass. As a result, under the same resonant frequency conditions, the resonant structure can have a larger vibration displacement and a larger induced signal.

Preferably, as shown in FIG. 3, in the resonant structure 100A' of another practical application, the heights H13 of the first protruding teeth 13 are different from each other, and the heights H13 of the first protruding teeth 13 are increased along the major axis L in the direction away from the support portion 12. The heights H22 of the second protruding teeth 22 are also different from each other, and the heights H22 of the second protruding teeth 22 are increased along the major axis L in the direction away from the support portion 12. In other words, the height H13 of each of the first protruding teeth 13 and the height H22 of each of the second protruding teeth 22 are increased in direct proportion to a swing distance of the induction portion 11. Accordingly, the traveling lengths S are gradually increased along the major axis L in the direction away from the support portion 12. That is to say, one of the traveling lengths S farthest from the support portion 12 is the longest, and one of the traveling lengths S closest to the support portion 12 is the shortest. In addition, surface areas of the first protruding teeth 13 and surface areas of the second protruding teeth 22 can be effectively increased, so that a capacitance of the electrode of the resonant structure 100A' can be greatly improved.

Naturally, in another embodiment of the present disclosure (not shown), the heights H13 of the first protruding teeth 13 may also be decreased along the major axis L in the direction away from the support portion 12, and the heights H22 of the second protruding teeth 22 correspond to the heights H13 of the first protruding teeth 13, so that an induction efficiency of the resonant structure 100A' is improved.

Figure 5:
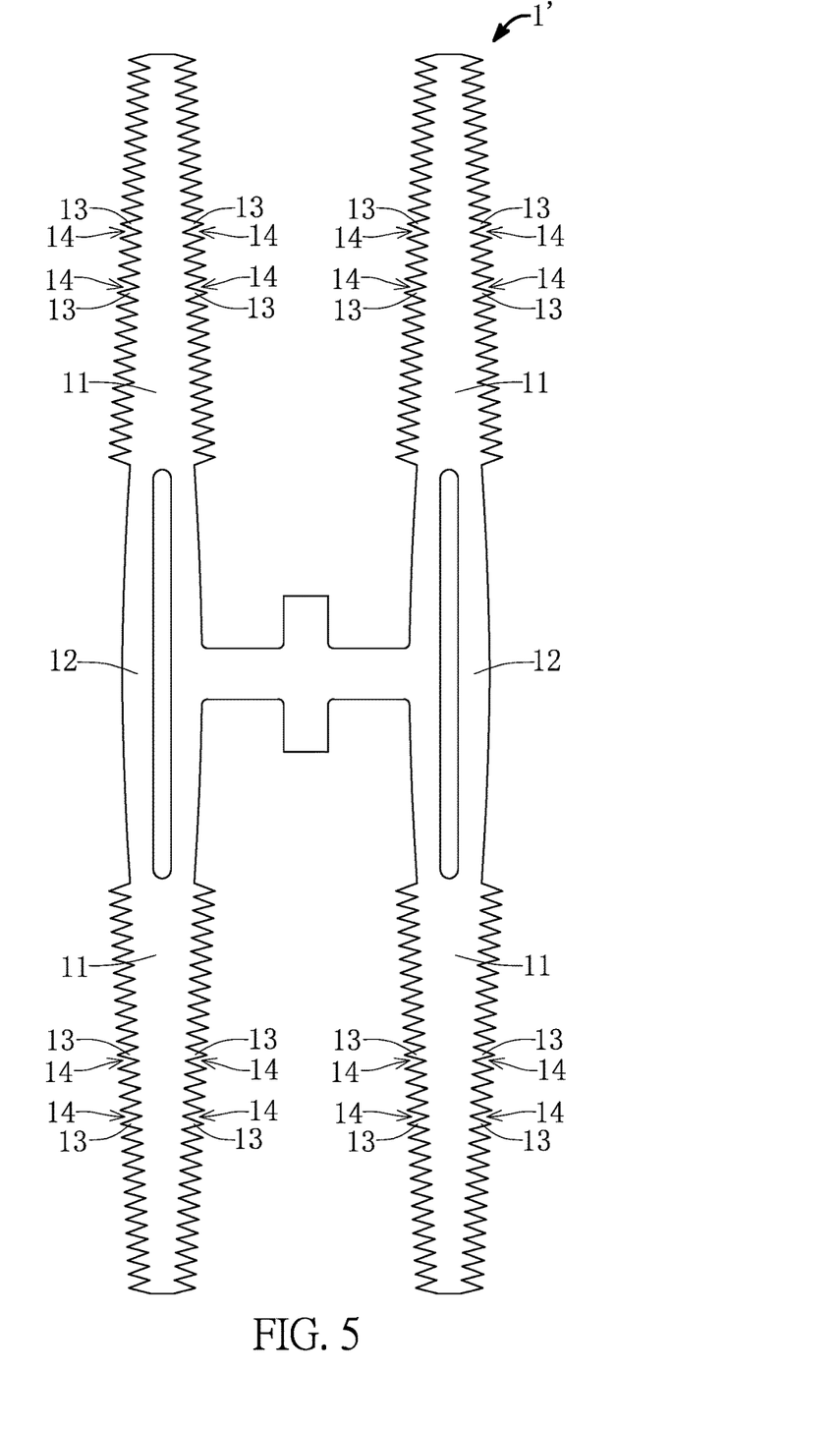
FIG. 5 is a schematic view showing an exemplary application of the resonant structure in the micro electro mechanical systems according to the first embodiment of the present disclosure.

It should also be noted that in the present embodiment, the main body 1 is illustrated as including one induction portion 11 and one support portion 12. However, in a practical application, a main body 1' can include multiple ones of the induction portion 11 and multiple ones of the support portion 12 (as shown in FIG. 5).

Second Embodiment

Figure 6:
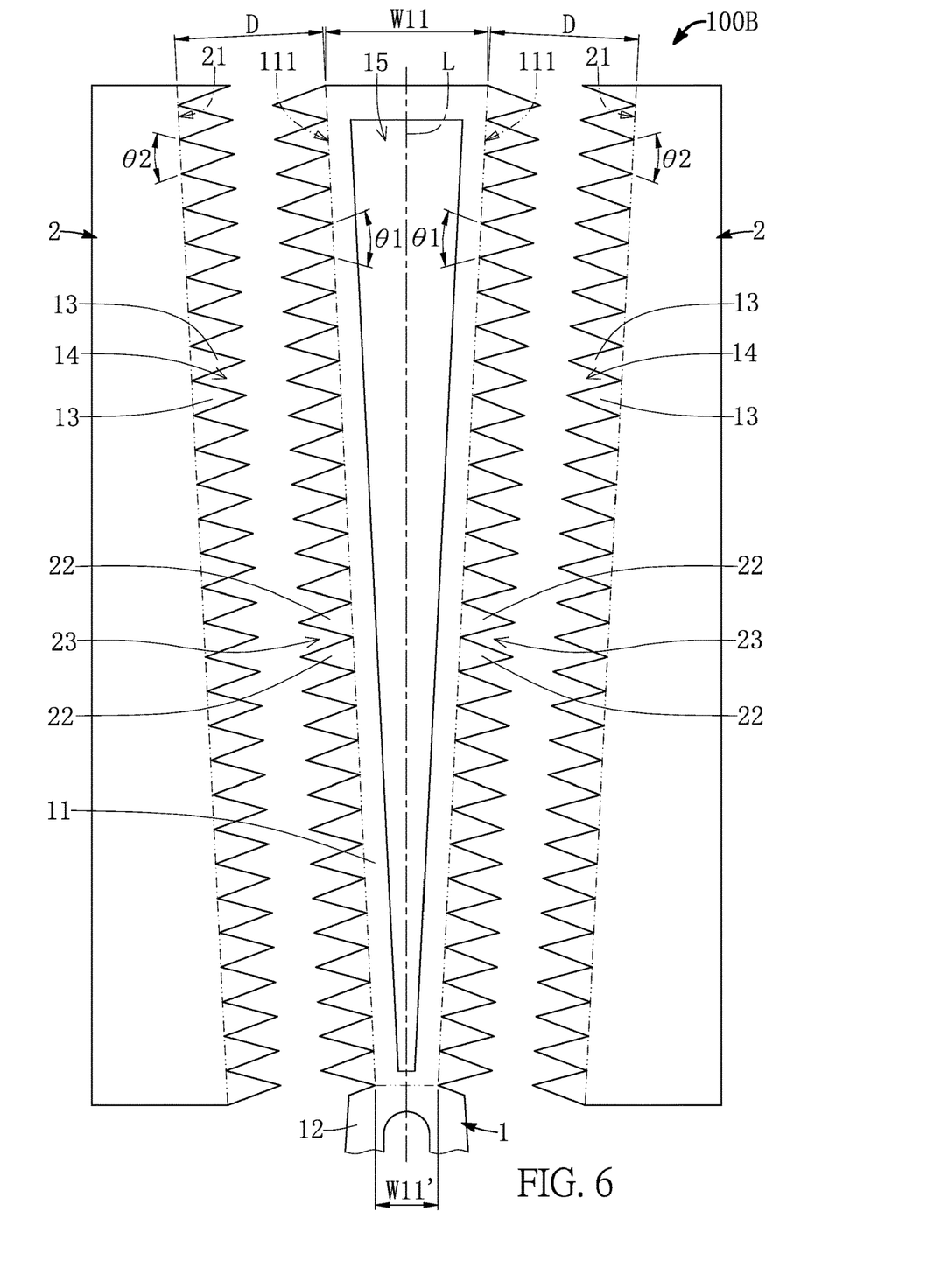
FIG. 6 is a schematic planar view of the resonant structure in the micro electro mechanical systems according to a second embodiment of the present disclosure.

Referring to FIG. 6, a second embodiment of the present disclosure provides a resonant structure 100B. The resonant structure 100B of the present embodiment is similar to the resonant structure 100A of the first embodiment, and the similarities therebetween will not be repeated herein. The differences between the present embodiment and the first embodiment are mainly as follows.

In the present embodiment, the width of the induction portion 11 is gradually increased along the major axis L in the direction away from the support portion 12 (e.g., a direction from the width W11' to the width W11 in FIG. 6). The main body 1 further has at least one notch 15 on the induction portion 11, and the configuration of the at least one notch 15 can reduce the weight of the induction portion 11.

In addition, the heights H13 and the tip angles of the first protruding teeth 13, and the heights H22 and the tip angles of the second protruding teeth 22 can be adjusted as in the first embodiment.

It is worth mentioning that the width of the main body 1 is gradually increased, and the first induction side surface 111 is not parallel to the major axis L, so that the resonant structure of the present disclosure can accommodate a larger electrode area and increase the mass. As a result, under the influence of the Coriolis force, the resonant structure has a larger sensing displacement and a larger induced signal (referring to a relevant formula of $F_{Coriolis}=-2m(\omega*v)$).

Third Embodiment

Figure 7:
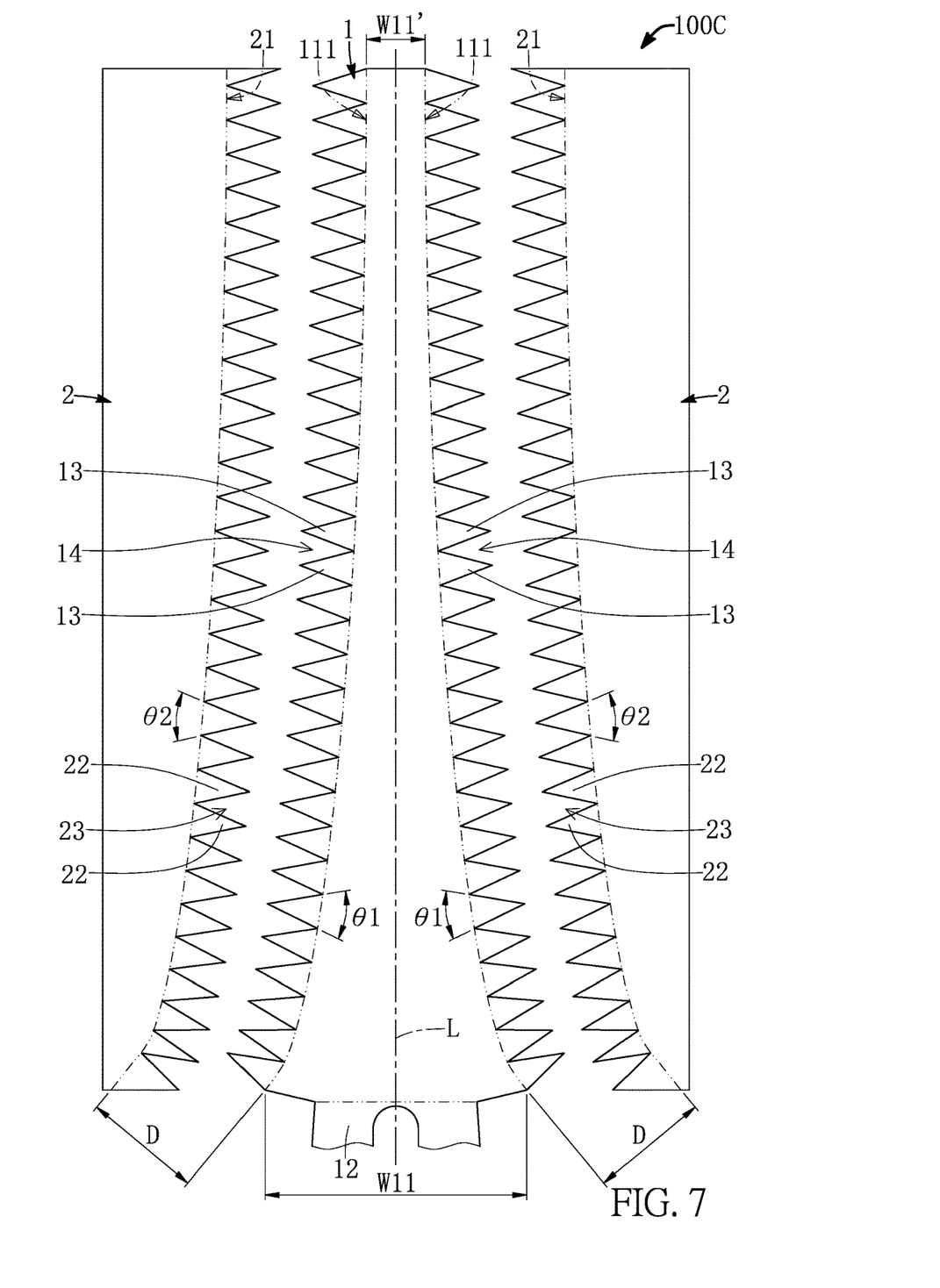
FIG. 7 is a schematic planar view of the resonant structure in the micro electro mechanical systems according to a third embodiment of the present disclosure.
Figure 8:
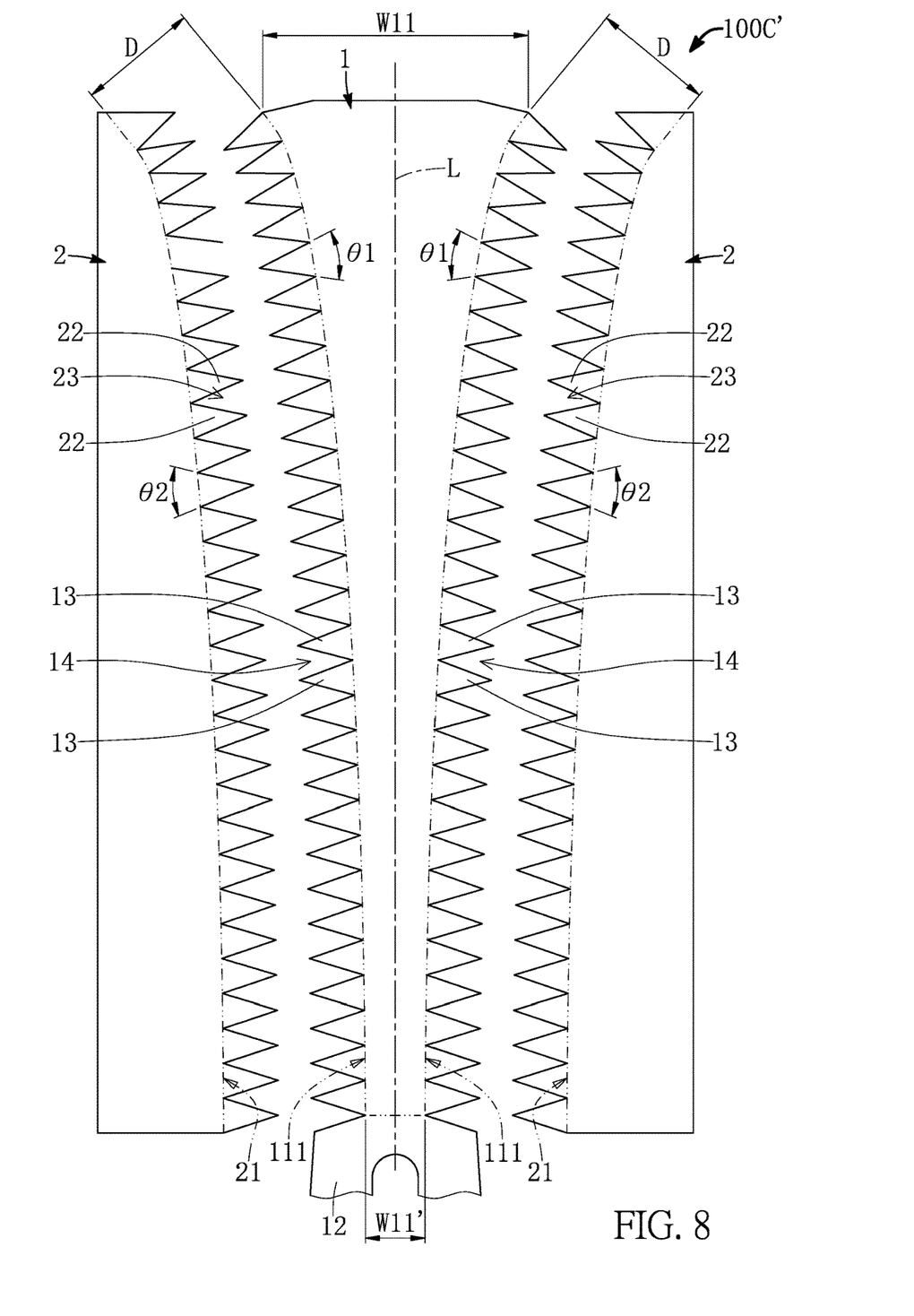
FIG. 8 is another schematic planar view of the resonant structure in the micro electro mechanical systems according to the third embodiment of the present disclosure.

Referring to FIG. 7 and FIG. 8, a third embodiment of the present disclosure provides resonant structures 100C, 100C' that are similar to the resonant structure 100A of the first embodiment or the resonant structure 100B of the second embodiment, and the similarities therebetween will not be repeated herein. The differences between the present embodiment and the first embodiment or the second embodiment are mainly as follows.

In the present embodiment, the two first induction side surfaces 111 are designed as curved surfaces, and each of the second induction side surfaces 21 is designed as a curved surface to geometrically match the first induction side surface 111.

Beneficial Effects of the Embodiments

In conclusion, in the resonant structure provided by the present disclosure, by virtue of "the induction portion having at least one first induction side surface that is not parallel to the major axis, and the main body having a plurality of first protruding teeth on the at least one first induction side surface" and "the second induction side surface corresponding in position to the at least one first induction side surface and being not parallel to the major axis, and the at least one electrode having a plurality of second protruding teeth on the second induction side surface," the resonant structure can significantly increase the traveling length and have a large initial electrostatic force at the same time.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A resonant structure in micro electro mechanical systems, comprising:
    a main body having a major axis, wherein the main body includes an induction portion and a support portion connected to the induction portion along the major axis, the induction portion has at least one first induction side surface that is not parallel to the major axis, and the main body has a plurality of first protruding teeth on the at least one first induction side surface; and
    at least one electrode disposed on one side of the induction portion and spaced apart from the induction portion, wherein the at least one electrode has a second induction side surface, and the second induction side surface corresponds in position to the at least one first induction side surface and is not parallel to the major axis, wherein the at least one electrode has a plurality of second protruding teeth on the second induction side surface, and the second protruding teeth and the first protruding teeth are interlaced and not in contact with each other, and wherein, when a separation distance between the at least one first induction side surface and the second induction side surface is changed, a plurality of surfaces of the first protruding teeth and a plurality of surfaces of the second protruding teeth are configured to produce a capacitance change;
    wherein a width of the induction portion is gradually increased or decreased along the major axis and in a direction away from the support portion.

2. The resonant structure according to claim 1, wherein the at least one first induction side surface corresponds in quantity to the at least one electrode, and a quantity of the at least one first induction side surface and a quantity of the at least one electrode are further limited to being two, and wherein each of the two electrodes is a driving electrode or a sensing electrode.

3. The resonant structure according to claim 1, wherein the at least one first induction side surface and the second induction side surface are each at least one of an inclined surface and a curved surface, wherein the inclined surface is inclined with respect to the major axis of the main body.

4. The resonant structure according to claim 1, wherein a width of the induction portion is gradually decreased along the major axis in a direction away from the support portion, so that heights of the first protruding teeth are different from each other, and the heights of the first protruding teeth are increased along the major axis in the direction away from the support portion.

5. The resonant structure according to claim 1, wherein the main body has a first groove between any two adjacent ones of the first protruding teeth, and the first groove corresponds in position and shape to an adjacent one of the second protruding teeth, wherein the at least one electrode has a second groove between any two adjacent ones of the second protruding teeth, and the second groove corresponds in position and shape to an adjacent one of the first protruding teeth, and wherein one of a plurality of traveling lengths is defined between the first groove and one of the second protruding teeth, another one of the traveling lengths is defined between the second groove and one of the first protruding teeth, and the traveling lengths are gradually increased along the major axis in a direction away from the support portion.

6. The resonant structure according to claim 1, wherein a plurality of tip angles of the first protruding teeth and a plurality of tip angles of the second protruding teeth are gradually decreased along the major axis in a direction away from the support portion.

7. The resonant structure according to claim 6, wherein each of the tip angles of the first protruding teeth and each of the tip angles of the second protruding teeth are greater than or equal to 10 degrees.

8. The resonant structure according to claim 1, wherein a width of the induction portion is gradually increased along the major axis in a direction away from the support portion, and the main body has at least one notch on the induction portion.

9. The resonant structure according to claim 1, wherein a width of the induction portion is gradually increased along the major axis in a direction away from the support portion, so that heights of the first protruding teeth are different from each other, and the heights of the first protruding teeth are decreased along the major axis in the direction away from the support portion.

10. A resonant structure in micro electro mechanical systems, comprising:
    a main body having a major axis, wherein the main body includes an induction portion and a support portion connected to the induction portion along the major axis, the induction portion has at least one first induction side surface that is not parallel to the major axis, and the main body has a plurality of first protruding teeth on the at least one first induction side surface; and
    at least one electrode disposed on one side of the induction portion and spaced apart from the induction portion, wherein the at least one electrode has a second induction side surface, and the second induction side surface corresponds in position to the at least one first induction side surface and is not parallel to the major axis, wherein the at least one electrode has a plurality of second protruding teeth on the second induction side surface, and the second protruding teeth and the first protruding teeth are interlaced and not in contact with each other, and wherein, when a separation distance between the at least one first induction side surface and the second induction side surface is changed, a plurality of surfaces of the first protruding teeth and a plurality of surfaces of the second protruding teeth are configured to produce a capacitance change;
    wherein the main body has a first groove between any two adjacent ones of the first protruding teeth, and the first groove corresponds in position and shape to an adjacent one of the second protruding teeth, wherein the at least one electrode has a second groove between any two adjacent ones of the second protruding teeth, and the second groove corresponds in position and shape to an adjacent one of the first protruding teeth, and wherein one of a plurality of traveling lengths is defined between the first groove and one of the second protruding teeth, another one of the traveling lengths is defined between the second groove and one of the first protruding teeth, and the traveling lengths are gradually increased along the major axis in a direction away from the support portion.

11. A resonant structure in micro electro mechanical systems, comprising:
    a main body having a major axis, wherein the main body includes an induction portion and a support portion connected to the induction portion along the major axis, the induction portion has at least one first induction side surface that is not parallel to the major axis, and the main body has a plurality of first protruding teeth on the at least one first induction side surface; and at least one electrode disposed on one side of the induction portion and spaced apart from the induction portion, wherein the at least one electrode has a second induction side surface, and the second induction side surface corresponds in position to the at least one first induction side surface and is not parallel to the major axis, wherein the at least one electrode has a plurality of second protruding teeth on the second induction side surface, and the second protruding teeth and the first protruding teeth are interlaced and not in contact with each other, and wherein, when a separation distance between the at least one first induction side surface and the second induction side surface is changed, a plurality of surfaces of the first protruding teeth and a plurality of surfaces of the second protruding teeth are configured to produce a capacitance change;

wherein a plurality of tip angles of the first protruding teeth and a plurality of tip angles of the second protruding teeth are gradually decreased along the major axis in a direction away from the support portion.

* * * * *